United States Patent
Liu et al.

(10) Patent No.: US 11,522,573 B1
(45) Date of Patent: Dec. 6, 2022

(54) TRANSCEIVER APPARATUS AND TRANSCEIVER APPARATUS OPERATION METHOD THEREOF HAVING PHASE-TRACKING MECHANISM

(71) Applicant: REALTEK SEMICONDUCTOR CORPORATION, Hsinchu (TW)

(72) Inventors: Yao-Chia Liu, Hsinchu (TW); Chi-Kung Kuan, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/519,599

(22) Filed: Nov. 5, 2021

(51) Int. Cl.
  *H04B 1/401* (2015.01)
  *H04L 7/033* (2006.01)
  *H03L 7/091* (2006.01)

(52) U.S. Cl.
  CPC ............. *H04B 1/401* (2013.01); *H03L 7/091* (2013.01); *H04L 7/033* (2013.01)

(58) Field of Classification Search
  CPC .......... H04B 1/401; H03L 7/091; H04L 7/033
  See application file for complete search history.

(56) References Cited

U.S. PATENT DOCUMENTS

| 5,907,585 A * | 5/1999 | Suzuki | H04L 27/3881 329/304 |
|---|---|---|---|
| 6,874,096 B1 * | 3/2005 | Norrell | H04L 7/042 713/400 |
| 7,777,577 B2 * | 8/2010 | Jennings | H03L 7/093 331/25 |
| 8,170,169 B2 * | 5/2012 | Martin | H03L 7/093 375/373 |
| 8,536,912 B2 * | 9/2013 | Cherkassky | H03L 7/0891 327/158 |
| 8,810,292 B2 * | 8/2014 | Katsushima | H03L 7/0893 327/148 |
| 10,057,050 B2 * | 8/2018 | Tsunoda | H03L 7/0807 |
| 2007/0206711 A1 * | 9/2007 | Aziz | H03L 7/093 375/375 |

FOREIGN PATENT DOCUMENTS

| CN | 107306178 B | * | 5/2021 | ............. H03K 19/21 |
|---|---|---|---|---|
| KR | 20220091880 A | * | 2/2022 | |

* cited by examiner

*Primary Examiner* — Adam D Houston

(57) ABSTRACT

The present invention discloses a transceiver apparatus having phase-tracking mechanism. A phase detection circuit of a receiver circuit performs sampling and phase detection on an input data signal according to a sampling clock signal to generate a phase detection result. A proportional gain circuit of the receiver circuit applies a proportional gain operation on the phase detection result to generate a phase adjusting signal. A CDR circuit of the receiver circuit receives a source clock signal to generate the sampling clock signal and performs phase-adjusting according to the phase adjusting signal. The integral gain circuit apples an integral gain operation on the phase detection result to generate a frequency adjusting signal. The source clock generating circuit receives a reference clock signal to generate the source clock signal and perform frequency-adjusting according to the frequency adjusting signal. The transmitter circuit performs signal transmission according to the source clock signal.

16 Claims, 3 Drawing Sheets

TRANSCEIVER APPARATUS AND TRANSCEIVER APPARATUS OPERATION METHOD THEREOF HAVING PHASE-TRACKING MECHANISM

BACKGROUND OF THE INVENTION

1. Field of the Invention

The present invention relates to a transceiver apparatus and a transceiver apparatus operation method having phase-tracking mechanism.

2. Description of Related Art

Repeater refers to any active component that acts on a signal in order to increase the physical lengths and/or reduce the interconnect loss over which the signal can be transmitted successfully. A category of repeaters includes retimers, in which a retimer refers to a component that contains a clock-data recovery (CDR) circuit that "retimes" the signal.

In the conventional design of the retimers, the tracking of the phase is easily affected by the tracking of the frequency operated under a lower frequency that results in the system latency. Further, when the receiver circuit and the transmitter circuit are required to operate under the same frequency, additional hardware is unavoidable. As a result, both the performance and the cost of the retimers are demanding to be improved.

SUMMARY OF THE INVENTION

In consideration of the problem of the prior art, an object of the present invention is to provide a transceiver apparatus and a transceiver apparatus operation method having phase-tracking mechanism.

The present invention discloses a transceiver apparatus having phase-tracking mechanism that includes a receiver circuit, an integral gain circuit, a source clock generating circuit and a transmitter circuit. The receiver circuit includes a phase detection circuit, a proportional gain circuit and a clock and data recovery (CDR) circuit. The phase detection circuit is configured to perform sampling and phase detection on an input data signal according to a sampling clock signal to generate a phase detection result. The proportional gain circuit is configured to apply a proportional gain operation on the phase detection result to generate a phase adjusting signal. The clock and data recovery circuit is configured to receive a source clock signal to generate the sampling clock signal and perform phase-adjusting thereto according to the phase adjusting signal. The integral gain circuit is configured to apply an integral gain operation on the phase detection result to generate a frequency adjusting signal. The source clock generating circuit is configured to receive a reference clock signal to generate the source clock signal and perform frequency-adjusting thereto according to the frequency adjusting signal. The transmitter circuit is configured to perform signal transmission according to the source clock signal.

The present invention also discloses a transceiver apparatus operation method having phase-tracking mechanism that includes steps outlined below. Sampling and phase detection is performed on an input data signal according to a sampling clock signal to generate a phase detection result by a phase detection circuit of a receiver circuit. A proportional gain operation is applied on the phase detection result to generate a phase adjusting signal by a proportional gain circuit of the receiver circuit. A source clock signal is received to generate the sampling clock signal and perform phase-adjusting thereto according to the phase adjusting signal by a clock and data recovery circuit of the receiver circuit. An integral gain operation is applied on the phase detection result to generate a frequency adjusting signal by an integral gain circuit. A reference clock signal is received to generate the source clock signal and frequency-adjusting is preformed thereto according to the frequency adjusting signal by a source clock generating circuit. Signal transmission is performed according to the source clock signal by a transmitter circuit.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide a transceiver apparatus and a transceiver apparatus operation method to improve the performance of the tracking and allow the transceiver circuit using the same source clock signal without additional hardware.

Figure 1:
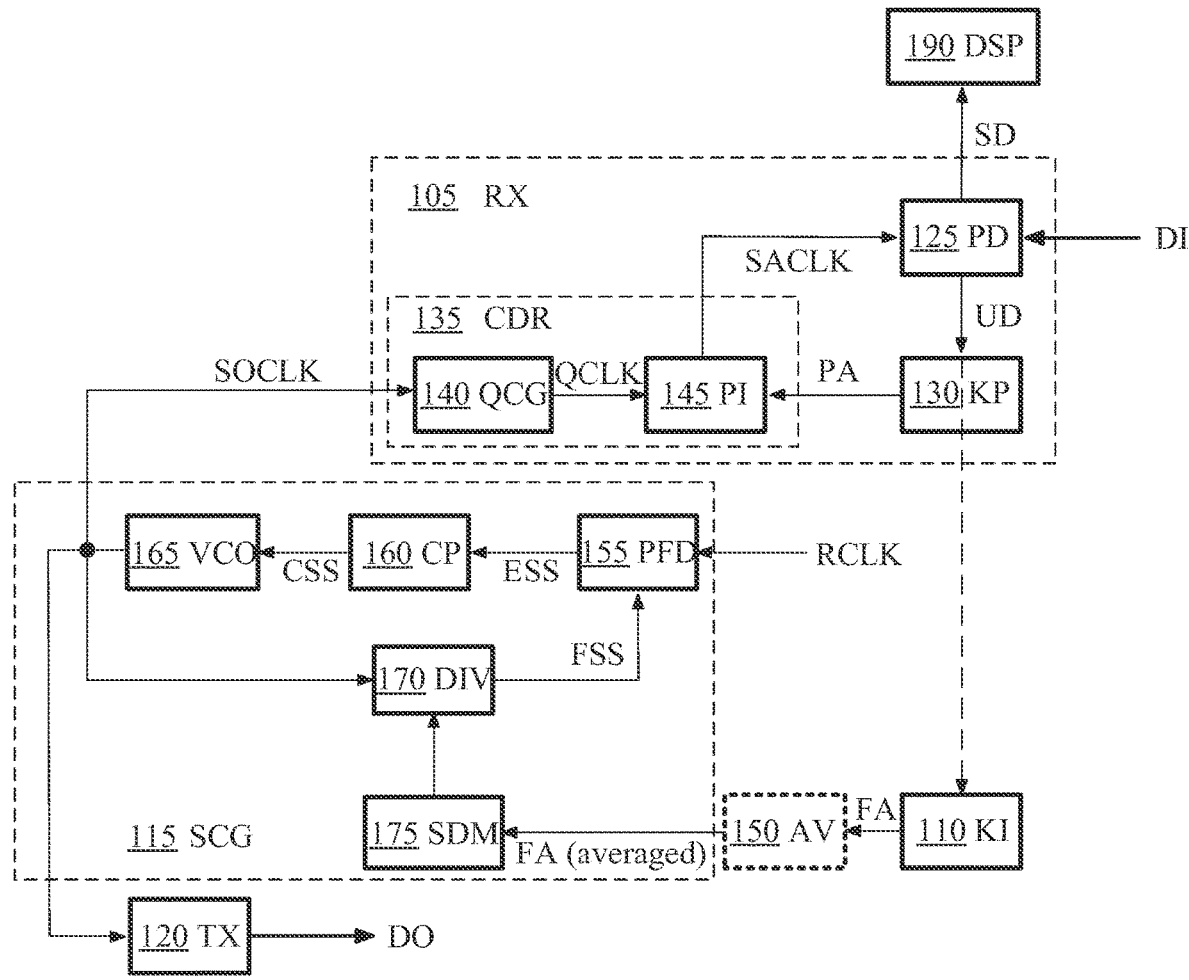
FIG. 1 illustrates a block diagram of a transceiver apparatus having phase-tracking mechanism according to an embodiment of the present invention.

Reference is now made to FIG. 1. FIG. 1 illustrates a block diagram of a transceiver apparatus 100 having phase-tracking mechanism according to an embodiment of the present invention. The transceiver apparatus 100 is able to perform data receiving and data transmission. In an embodiment, the transceiver apparatus 100 is a repeater device such as, but not limited to a retimer using a passive optical network (PON) serializer and deserializers (SERDES) configuration.

The transceiver apparatus 100 includes a receiver circuit 105 (abbreviated as RX in FIG. 1), an integral gain circuit 110 (abbreviated as KI in FIG. 1), a source clock generating circuit 115 (abbreviated as SCG in FIG. 1) and a transmitter circuit 120 (abbreviated as TX in FIG. 1).

The receiver circuit 105 is configured to perform data receiving, and includes a phase detection circuit 125 (abbreviated as PD in FIG. 1), a proportional gain circuit 130 (abbreviated as KP in FIG. 1) and a clock and data recovery circuit 135 (abbreviated as CDR in FIG. 1).

The phase detection circuit 125 receives the input data signal DI from an external electronic apparatus (not illustrated) through a network. In an embodiment, an equalizer circuit (not illustrated) may be disposed in front of the phase detection circuit 125 such that the phase detection circuit 125 receives the equalized input data signal DI.

The phase detection circuit 125 is configured to perform sampling and phase detection on an input data signal DI according to a sampling clock signal SACLK having a plurality of phases to generate a sampled data signal SD and a phase detection result UD.

In an embodiment, the sampling clock signal SACLK includes a set of clock signals having different phases to sample the input data signal DI and generate a plurality of sampling results.

According to the sampling results, the sampled data signal SD can be generated. In an embodiment, the sampled data signal SD is transmitted to a digital signal processing circuit 190 (abbreviated as DSP in FIG. 1) such that the digital signal processing circuit 190 processes the sampled data signal SD. In an embodiment, the digital signal processing circuit 190 may perform such as, but not limited to demultiplexing, decoding and other digital processing on the sampled data signal SD.

Further, according to the sampling results, the phase detection result UD, which implies a relation between an edge of the input data signal DI and edges of the sampling clock signal SACLK corresponding to the different phases, can be obtained as well.

The phase detection result UD includes information of a phase relation between the sampling clock signal SACLK and the input data signal DI. In an embodiment, the phase detection result UD includes a first value implying a phase-lead condition (i.e., 'up' condition) or a second value implying a phase-lag condition (i.e., 'down' condition). For example, the first value is +1 and the second value is −1. However, the present invention is not limited thereto.

The proportional gain circuit 130 is configured to extract phase relation information from the phase detection result UD. More specifically, the proportional gain circuit 130 is configured to apply a proportional gain operation on the phase detection result UD to generate a phase adjusting signal PA. In an embodiment, the proportional gain circuit 130 multiplies the value included in the phase detection result UD by a gain value to generate the phase adjusting signal PA.

The clock and data recovery circuit 135 is configured to receive a source clock signal SOCLK to generate the sampling clock signal SACLK and perform phase-adjusting thereto according to the phase adjusting signal PA.

In an embodiment, the clock and data recovery circuit 135 may be implemented by using the configuration illustrated in FIG. 1, which includes a quadrature-phase clock generating circuit 140 (abbreviated as QCG in FIG. 1) and a phase interpolating circuit 145 (abbreviated as PI in FIG. 1). The quadrature-phase clock generating circuit 140 is configured to generate a quadrature-phase clock signal QCLK according to the source clock signal SOCLK. The phase interpolating circuit 145 is configured to perform phase interpolation on the quadrature-phase clock signal QCLK to generate the sampling clock signal SACLK.

In another embodiment, the clock and data recovery circuit 135 may also include only the phase interpolating circuit 145 that performs phase interpolation directly on the source clock signal SOCLK that has a plurality of phases.

Figure 2:
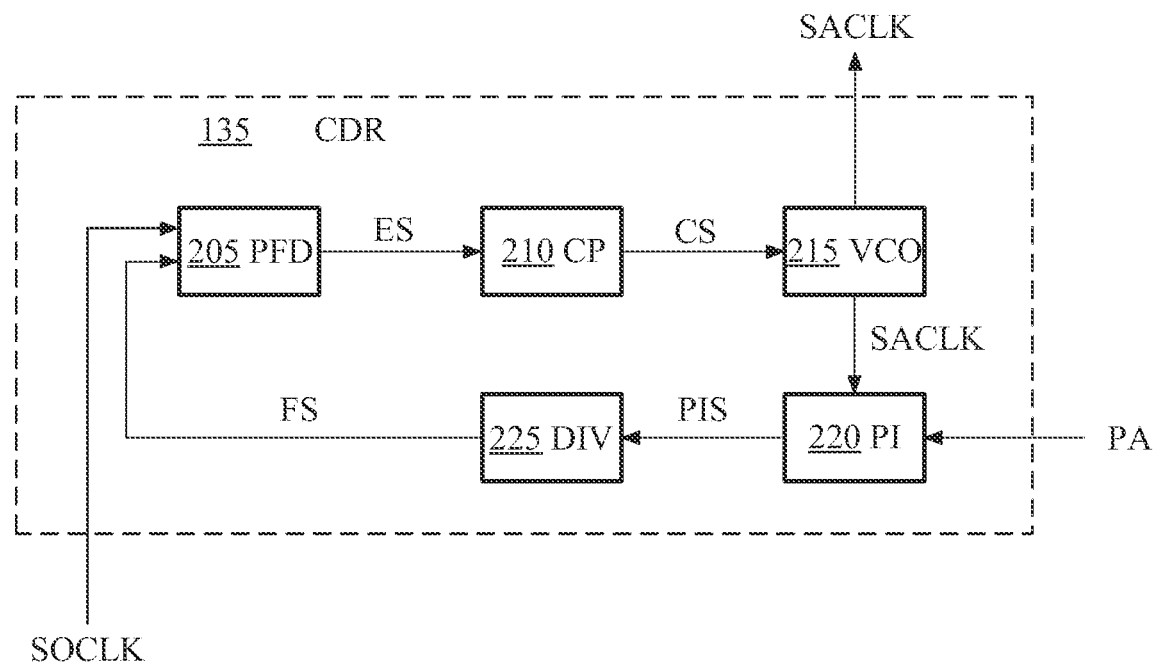
FIG. 2 illustrates a block diagram of the clock and data recovery circuit according to yet another embodiment of the present invention.

Reference is now made to FIG. 2. FIG. 2 illustrates a block diagram of the clock and data recovery circuit 135 according to yet another embodiment of the present invention.

As illustrated in FIG. 2, in the present embodiment, the clock and data recovery circuit 135 includes a phase and frequency detecting circuit 205 (abbreviated as PFD in FIG. 2), a charge pump circuit 210 (abbreviated as CP in FIG. 2), a voltage-controlled oscillator 215 (abbreviated as VCO in FIG. 2), a phase interpolating circuit 220 (abbreviated as PI in FIG. 2) and a frequency dividing circuit 225 (abbreviated as DIV in FIG. 2).

The phase and frequency detecting circuit 205 is configured to perform phase and frequency error detection between the source clock signal SOCLK and a feedback signal FS to generate an error signal ES, in which the error signal ES stands for the phase relation and the frequency relation therebetween.

The charge pump circuit 210 is configured to generate a control signal CS according to the error signal ES. More specifically, the charge pump circuit 210 may perform current charging or current draining according to the error signal ES to generate the control signal CS having different voltage levels.

The voltage-controlled oscillator 215 is configured to generate the sampling clock signal SACLK according to the control signal CS.

The phase interpolating circuit 220 is configured to perform phase interpolation on the sampling clock signal SACLK to generate a phase-interpolated signal PIS.

The frequency dividing circuit 225 is configured to perform frequency division on the phase-interpolated signal PIS to generate the feedback signal FS. As a result, the circuits in the clock and data recovery circuit 135 together form a feedback loop to track the phase of the input data signal DI by adjusting the phase of the sampling clock signal SACLK according to the phase adjusting signal PA.

It is appreciated that the clock and data recovery circuit 135 can be implemented by using various kinds of clock and data recovery technologies. The present invention is not limited thereto.

As a result, the proportional gain circuit 130 and the clock and data recovery circuit 135 together form a proportional path of a digital loop filter. By performing phase-adjusting on the sampling clock signal SACLK according to the phase relation information presented in the phase detection result UD, the phase of the input data signal DI can be tracked to reduce the phase difference between the sampling clock signal SACLK and the input data signal DI.

Besides the phase relation information, the phase detection result UD also includes information of a frequency relation between the sampling clock signal SACLK and the input data signal DI that requires a longer term of observation to be extracted.

The integral gain circuit 110 is configured to extract the frequency relation information. More specifically, the integral gain circuit 110 is configured to apply an integral gain operation on the phase detection result UD to generate a frequency adjusting signal FA. In an embodiment, the integral gain circuit 110 can be disposed outside of the receiver circuit 105.

It is appreciated that the phase detection result UD is illustrated to be transmitted through a dashed line crossing the proportional gain circuit 130 in FIG. 1. However, the phase detection result UD can be either bypassed directly to the integral gain circuit 110, or be processed by a demultiplexer (not illustrated in the figure) disposed in one of the integral gain circuit 110 and the proportional gain circuit 130 to lower the frequency thereof.

In an embodiment, the integral gain circuit 110 accumulates the value included in the phase detection result UD to generate the frequency adjusting signal FA, such that the frequency adjusting signal FA is further transmitted to the source clock generating circuit 115.

In an embodiment, the transceiver apparatus 100 may further selectively include an averaging circuit 150 (abbreviated as AV in FIG. 1). The averaging circuit 150 is configured to perform averaging on the frequency adjusting signal FA to generate an averaged frequency adjusting signal FA, such that source clock generating circuit 115 substantially receives the averaged frequency adjusting signal FA.

More specifically, in an embodiment, the operation frequency (e.g., 805 MHz) of the integral gain circuit 110 is higher than the operation frequency (e.g., 156.25 MHz) of the source clock generating circuit 115. The averaging circuit 150 may store the information of the frequency adjusting signal FA for a period of time to average the information and generate the averaged frequency adjusting signal FA. The averaging circuit 150 thus provides a frequency conversion mechanism to convert the frequency adjusting signal FA having a relatively higher frequency to the averaged frequency adjusting signal FA having a relatively lower frequency such that the source clock generating circuit 115 operates according to the averaged frequency adjusting signal FA. It is appreciated that the values of the operation frequencies described above is merely an example. The present invention is not limited thereto.

The source clock generating circuit 115 is configured to receive a reference clock signal RCLK to generate the source clock signal SOCLK and perform frequency-adjusting thereto according to the averaged frequency adjusting signal FA.

In an embodiment, the source clock generating circuit 115 may be implemented by using the configuration illustrated in FIG. 1, which includes a phase and frequency detecting circuit 155 (abbreviated as PFD in FIG. 1), a charge pump circuit 160 (abbreviated as CP in FIG. 1), a voltage-controlled oscillator 165 (abbreviated as VCO in FIG. 1), a frequency dividing circuit 170 (abbreviated as DIV in FIG. 1) and a sigma-delta modulating circuit 175 (abbreviated as SDM in FIG. 1).

The phase and frequency detecting circuit 155 is configured to perform phase and frequency error detection between the reference clock signal RCLK and a feedback signal FSS to generate an error signal ESS.

The charge pump circuit 160 is configured to generate a control signal CSS according to the error signal ESS. More specifically, the charge pump circuit 160 may perform current charging or current draining according to the error signal ESS to generate the control signal CSS having different voltage levels.

The voltage-controlled oscillator 165 is configured to generate the source clock signal SOCLK according to the control signal CSS.

The frequency dividing circuit 170 is configured to perform frequency division on the source clock signal SOCLK to generate the feedback signal FSS.

The sigma-delta modulating circuit 175 is configured to adjust a divisor used to perform frequency division according to the averaged frequency adjusting signal FA, such that frequency dividing circuit 170 and the sigma-delta modulating circuit 175 thus together operate as a fractional-N frequency divider circuit. More specifically, a code of the sigma-delta modulating circuit 175 can be modified according to the averaged frequency adjusting signal FA that includes the information of frequency difference to adjust the divisor. The tracking of the frequency is performed without adjusting the phase interpolating circuit 145 in the clock and data recovery circuit 135.

Figure 3:
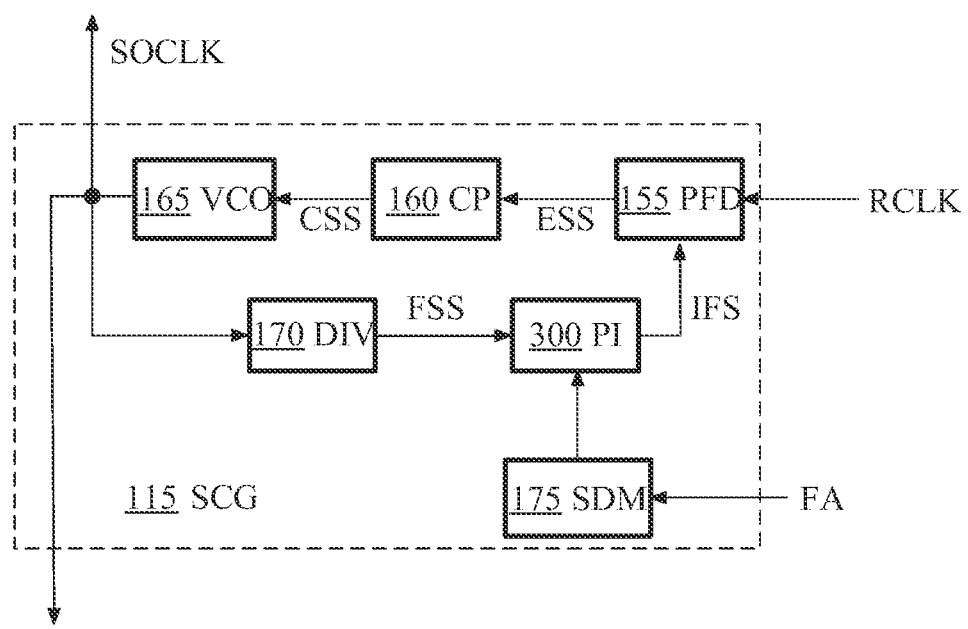
FIG. 3 illustrates a block diagram of the source clock generating circuit according to another embodiment of the present invention.

Reference is now made to FIG. 3. FIG. 3 illustrates a block diagram of the source clock generating circuit 115 according to another embodiment of the present invention.

The source clock generating circuit 115 may be implemented by using the configuration illustrated in FIG. 3, which includes the components illustrated in FIG. 1, e.g., phase and frequency detecting circuit 155, the charge pump circuit 160, the voltage-controlled oscillator 165, the frequency dividing circuit 170 and the sigma-delta modulating circuit 175, and further includes a phase interpolating circuit 300 (abbreviated as PI in FIG. 3).

The operation of the phase and frequency detecting circuit 155, the charge pump circuit 160 and the voltage-controlled oscillator 165 is the same as the operation of those components illustrated in FIG. 1. As a result, the detail of the operation of these components in FIG. 3 is not described herein.

The frequency dividing circuit 170 is configured to perform frequency division on the source clock signal SOCLK to generate the feedback signal FSS.

The phase interpolating circuit 300 is configured to perform phase interpolation on the feedback signal FSS according to an interpolation parameter to generate an interpolated feedback signal IFS.

The sigma-delta modulating circuit 175 is configured to adjust the interpolation parameter according to the averaged frequency adjusting signal FA, such that phase interpolating circuit 300. As a result, the phase interpolating circuit 300, the frequency dividing circuit 170 and the sigma-delta modulating circuit 175 thus together operate as a fractional-N frequency divider circuit. More specifically, a code of the sigma-delta modulating circuit 175 can be modified according to the averaged frequency adjusting signal FA that includes the information of frequency difference to adjust the interpolation parameter.

As a result, the integral gain circuit 110 and the source clock generating circuit 115 together form an integral path of a digital loop filter. By performing frequency-adjusting on the source clock signal SOCLK according to the frequency relation information presented in the phase detection result UD, the frequency of the input data signal DI can be tracked to reduce the frequency difference between the sampling clock signal SACLK and the input data signal DI.

In an embodiment, when the frequency relations are presented in the phase detection result UD, a DC offset is presented in a value of the phase adjusting signal PA, and an AC term of the value of the phase adjusting signal PA shows that an occurrence probability of one of the phase-lead condition and the phase-lag condition is larger than the occurrence probability of the other one of the phase-lead condition and the phase-lag condition.

When the frequency relation are both minimized, the DC offset turns to 0 and the AC term of the value of the phase adjusting signal PA shows that the occurrence probabilities of the phase-lead condition and the phase-lag condition are substantially the same.

The transmitter circuit 120 is configured to perform signal transmission according to the source clock signal SOCLK to transmit an output data signal DO. As a result, the receiver circuit 105 and the transmitter circuit 120 can use the same source clock signal SOCLK, such that the data receiving and the data transmitting are operated under the same frequency.

In some approaches, a proportional-integral-derivative (PID) circuit is used in the clock and data recovery circuit to track the phase and the frequency at the same time. Under such a condition, the integral part of the PID circuit requires a longer processing time such that the speed of the phase-tracking is affected and the system latency is thus presented.

Further, in order to keep the transmitter circuit operating under the same frequency as the input data signal of the receiver circuit, an additional phase interpolator that stores the frequency difference information of the receiver circuit is required to transmit the source clock signal to the transmitter circuit such that transmitter circuit can operate under such frequency even though the receiver circuit stops to receive new input data signal. Moreover, in order to have the transmitter circuit to receive a clean source clock signal, an additional low pass filter is required. The configuration described above is thus area consuming and power consuming.

In the present invention, the transceiver apparatus separates the proportional path and the integral path of the digital loop filter such that the proportional path tracks the phase under a higher frequency and the integral path, operating together with the source clock generating circuit, tracks the frequency under a lower frequency. Since the frequency tracking mechanism is implemented in the source clock generating circuit, the receiver circuit and the transmitter circuit are able to operate under the same frequency without additional phase interpolator. Further, the source clock generating circuit itself includes a low pass filtering mechanism such that the additional low pass filter is not required for the transmitter circuit.

As a result, the transceiver apparatus in the present invention not only improves the performance of the receiver circuit, but also reduces the area cost and the power consumption. Further, since the digital loop filter is implemented by the digital circuit, the process migration is easier to be accomplished.

Figure 4:
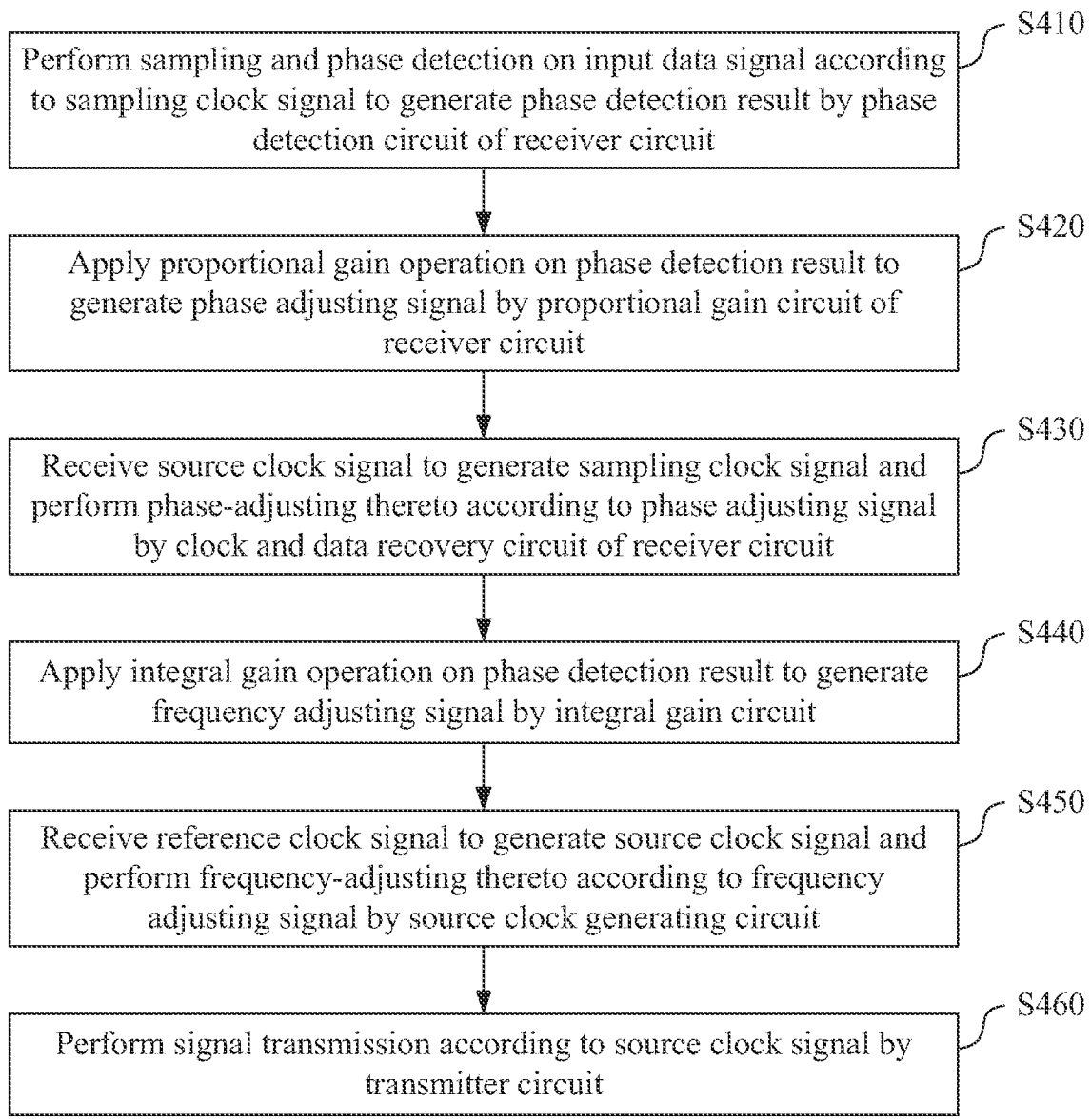
FIG. 4 illustrates a flow chart of a transceiver apparatus operation method according to an embodiment of the present invention.

Reference is now made to FIG. 4. FIG. 4 illustrates a flow chart of a transceiver apparatus operation method 400 according to an embodiment of the present invention.

In addition to the apparatus described above, the present disclosure further provides the transceiver apparatus operation method 400 that can be used in such as, but not limited to, the transceiver apparatus 100 in FIG. 1. As illustrated in FIG. 4, an embodiment of the transceiver apparatus operation method 400 includes the following steps.

In step S410, sampling and phase detection is performed on the input data signal DI according to the sampling clock signal SACLK to generate the phase detection result UD by the phase detection circuit 125 of the receiver circuit 105.

In step S420, the proportional gain operation is applied on the phase detection result UD to generate the phase adjusting signal PA by the proportional gain circuit 130 of the receiver circuit 105.

In step S430, the source clock signal SOCLK is received to generate the sampling clock signal SACLK and perform phase-adjusting thereto according to the phase adjusting signal PA by the clock and data recovery circuit 135 of the receiver circuit 105.

In step S440, the integral gain operation is applied on the phase detection result UD to generate the frequency adjusting signal FA by the integral gain circuit 110.

In step S450, the reference clock signal RCLK is received to generate the source clock signal SOCLK and frequency-adjusting is preformed thereto according to the frequency adjusting signal FA by the source clock generating circuit 115.

In step S460, signal transmission is performed according to the source clock signal SOCLK by the transmitter circuit 120.

It is appreciated that the embodiments described above are merely an example. In other embodiments, it should be appreciated that many modifications and changes may be made by those of ordinary skill in the art without departing from the spirit of the disclosure.

In summary, the transceiver apparatus and the transceiver apparatus operation method of the present invention separates the proportional path and the integral path of the digital loop filter to track the phase under a higher frequency by using the clock and data recovery circuit and track the frequency under a lower frequency by using the source clock generating circuit. The performance of the tracking can be improved and the transceiver circuit can use the same source clock signal without additional hardware.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A transceiver apparatus having phase-tracking mechanism comprising:
 a receiver circuit comprising:
  a phase detection circuit configured to perform sampling and phase detection on an input data signal according to a sampling clock signal having a plurality of phases to generate a phase detection result;
  a proportional gain circuit configured to apply a proportional gain operation on the phase detection result to generate a phase adjusting signal; and
  a clock and data recovery (CDR) circuit configured to receive a source clock signal to generate the sampling clock signal and perform phase-adjusting thereto according to the phase adjusting signal;
 an integral gain circuit configured to apply an integral gain operation on the phase detection result to generate a frequency adjusting signal;
 a source clock generating circuit configured to receive a reference clock signal to generate the source clock signal and perform frequency-adjusting thereto according to the frequency adjusting signal; and
 a transmitter circuit configured to perform signal transmission according to the source clock signal.

2. The transceiver apparatus of claim 1, wherein the clock and data recovery circuit further comprises:
 a quadrature-phase clock generating circuit configured to generate a quadrature-phase clock signal according to the source clock signal; and
 a phase interpolating circuit configured to perform phase interpolation on the quadrature-phase clock signal to generate the sampling clock signal.

3. The transceiver apparatus of claim 1, wherein the clock and data recovery circuit further comprises:
 a phase and frequency detecting circuit configured to perform phase and frequency error detection between the source clock signal and a feedback signal to generate an error signal;
 a charge pump circuit configured to generate a control signal according to the error signal;
 a voltage-controlled oscillator configured to generate the sampling clock signal according to the control signal;
 a phase interpolating circuit configured to perform phase interpolation on the sampling clock signal to generate a phase-interpolated signal; and a frequency dividing circuit configured to perform frequency division on the phase-interpolated signal to generate the feedback signal.

4. The transceiver apparatus of claim 1, further comprising an averaging circuit configured to perform averaging on the frequency adjusting signal to generate an averaged frequency adjusting signal, such that the source clock generating circuit substantially performs frequency-adjusting according to the averaged frequency adjusting signal.

5. The transceiver apparatus of claim 1, wherein the source clock generating circuit comprises:
- a phase and frequency detecting circuit configured to perform phase and frequency error detection between the reference clock signal and a feedback signal to generate an error signal;
- a charge pump circuit configured to generate a control signal according to the error signal;
- a voltage-controlled oscillator configured to generate the source clock signal according to the control signal;
- a frequency dividing circuit configured to perform frequency division on the source clock signal to generate the feedback signal; and
- a sigma-delta modulating circuit configured to adjust a divisor used to perform frequency division according to the frequency adjusting signal.

6. The transceiver apparatus of claim 1, wherein the source clock generating circuit comprises:
- a phase and frequency detecting circuit configured to perform phase and frequency error detection between the reference clock signal and an interpolated feedback signal to generate an error signal;
- a charge pump circuit configured to generate a control signal according to the error signal;
- a voltage-controlled oscillator configured to generate the source clock signal according to the control signal;
- a frequency dividing circuit configured to perform frequency division on the source clock signal to generate a feedback signal;
- a phase interpolating circuit configured to perform phase interpolation on the feedback signal according to an interpolation parameter to generate the interpolated feedback signal; and
- a sigma-delta modulating circuit configured to adjust the interpolation parameter according to the frequency adjusting signal.

7. The transceiver apparatus of claim 1, wherein the phase detection result comprises a first value implying a phase-lead condition or a second value implying a phase-lag condition.

8. The transceiver apparatus of claim 1, wherein the phase detection circuit further generates a sampled data signal such that a digital signal processing circuit processes the sampled data signal.

9. A transceiver apparatus operation method having phase-tracking mechanism comprising:
- performing sampling and phase detection on an input data signal according to a sampling clock signal having a plurality of phases to generate a phase detection result by a phase detection circuit of a receiver circuit;
- applying a proportional gain operation on the phase detection result to generate a phase adjusting signal by a proportional gain circuit of the receiver circuit;
- receive a source clock signal to generate the sampling clock signal and perform phase-adjusting thereto according to the phase adjusting signal by a clock and data recovery circuit of the receiver circuit;
- applying an integral gain operation on the phase detection result to generate a frequency adjusting signal by an integral gain circuit;
- receiving a reference clock signal to generate the source clock signal and performing frequency-adjusting thereto according to the frequency adjusting signal by a source clock generating circuit; and
- performing signal transmission according to the source clock signal by a transmitter circuit.

10. The transceiver apparatus operation method of claim 9, further comprising:
- generating a quadrature-phase clock signal according to the source clock signal by a quadrature-phase clock generating circuit of the clock and data recovery circuit;
- performing phase interpolation on the quadrature-phase clock signal to generate the sampling clock signal by a phase interpolating circuit of the clock and data recovery circuit.

11. The transceiver apparatus operation method of claim 9, further comprising:
- performing phase and frequency error detection between the source clock signal and a feedback signal to generate an error signal by a phase and frequency detecting circuit of the clock and data recovery circuit;
- generating a control signal according to the error signal by a charge pump circuit of the clock and data recovery circuit;
- generating the sampling clock signal according to the control signal by a voltage-controlled oscillator of the clock and data recovery circuit;
- performing phase interpolation on the sampling clock signal to generate a phase-interpolated signal by a phase interpolating circuit of the clock and data recovery circuit; and
- performing frequency division on the phase-interpolated signal to generate the feedback signal by a frequency dividing circuit of the clock and data recovery circuit.

12. The transceiver apparatus operation method of claim 9, wherein the transceiver apparatus further comprises an averaging circuit, and the transceiver apparatus operation method further comprises:
- performing averaging on the frequency adjusting signal to generate an averaged frequency adjusting signal by the averaging circuit, such that the source clock generating circuit substantially performs frequency-adjusting according to the averaged frequency adjusting signal.

13. The transceiver apparatus operation method of claim 9, further comprising:
- performing phase and frequency error detection between the reference clock signal and a feedback signal to generate an error signal by a phase and frequency detecting circuit of the source clock generating circuit;
- generating a control signal according to the error signal by a charge pump circuit of the source clock generating circuit;
- generating the source clock signal according to the control signal by a voltage-controlled oscillator of the source clock generating circuit;
- performing frequency division on the source clock signal to generate the feedback signal by a frequency dividing circuit of the source clock generating circuit; and
- adjusting a divisor used to perform frequency division according to the frequency adjusting signal by a sigma-delta modulating circuit of the source clock generating circuit.

14. The transceiver apparatus operation method of claim 9, further comprising:
- performing phase and frequency error detection between the reference clock signal and an interpolated feedback signal to generate an error signal by a phase and frequency detecting circuit of the source clock generating circuit;
- generating a control signal according to the error signal by a charge pump circuit of the source clock generating circuit;
- generating the source clock signal according to the control signal by a voltage-controlled oscillator of the source clock generating circuit;
- performing frequency division on the source clock signal to generate a feedback signal by a frequency dividing circuit of the source clock generating circuit;
- performing phase interpolation on the feedback signal according to an interpolation parameter to generate the interpolated feedback signal by a phase interpolating circuit of the source clock generating circuit; a and
- adjusting the interpolation parameter according to the frequency adjusting signal by a sigma-delta modulating circuit of the source clock generating circuit.

15. The transceiver apparatus operation method of claim 9, wherein the phase detection result comprises a first value implying a phase-lead condition or a second value implying a phase-lag condition.

16. The transceiver apparatus operation method of claim 9, further comprising:
- generating a sampled data signal by the phase detection circuit such that a digital signal processing circuit processes the sampled data signal.

\* \* \* \* \*